United States Patent [19]
Gardner et al.

[11] Patent Number: 6,162,688
[45] Date of Patent: Dec. 19, 2000

[54] METHOD OF FABRICATING A TRANSISTOR WITH A DIELECTRIC UNDERLAYER AND DEVICE INCORPORATING SAME

[75] Inventors: Mark I. Gardner, Cedar Creek; H. Jim Fulford; Derick J. Wristers, both of Austin, all of Tex.

[73] Assignee: Advanced Micro Devices, Inc., Austin, Tex.

[21] Appl. No.: 09/231,427

[22] Filed: Jan. 14, 1999

[51] Int. Cl.[7] .......................... H01L 21/336; H01L 21/00
[52] U.S. Cl. .......................... 438/289; 438/155; 438/164; 438/300; 438/595
[58] Field of Search ...................... 438/289, 303, 438/305, 154, 155, 163, 164, 149, 152, 153, 481, 151, 585, 596

[56] References Cited

U.S. PATENT DOCUMENTS

| | | | |
|---|---|---|---|
| 4,677,735 | 7/1987 | Malhi | 438/154 |
| 5,700,700 | 12/1997 | Hwang | 438/163 |
| 5,705,405 | 1/1998 | Cunningham | 438/157 |
| 5,904,508 | 5/1999 | Codama et al. | 438/163 |
| 6,074,919 | 6/2000 | Gardner et al. | 438/287 |
| 6,074,920 | 6/2000 | Houston | 438/289 |
| 6,103,559 | 8/2000 | Gardner et al. | 438/183 |

*Primary Examiner*—Michael Trinh
*Attorney, Agent, or Firm*—Williams, Morgan & Amerson

[57] ABSTRACT

A method is provided for fabricating a transistor, the method including forming a dielectric layer above a structure, forming a first polysilicon layer above the dielectric layer and forming a sacrificial region above the first polysilicon layer. The method also includes forming a second polysilicon layer above the first polysilicon layer and adjacent the sacrificial region. The method further includes removing the sacrificial region to form an opening in the second polysilicon layer, the opening having sidewalls, and forming dielectric spacers on the sidewalls of the opening. In addition, the method includes forming a gate dielectric within the opening above the first polysilicon layer and forming a gate conductor above the gate dielectric.

20 Claims, 6 Drawing Sheets

METHOD OF FABRICATING A TRANSISTOR WITH A DIELECTRIC UNDERLAYER AND DEVICE INCORPORATING SAME

BACKGROUND OF THE INVENTION

1. Field of the Invention

This invention relates generally to semiconductor fabrication technology and, more particularly, to a method of fabricating a transistor with a dielectric underlayer.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, the reduction in the channel length of a transistor also requires a reduction in the depth of the source/drain regions adjacent the gate conductor. As source/drain junctions get shallower, the implantation to prevent punch-through also gets shallower. In turn, the shallower punch-through implant tends to invade the space of the threshold voltage ($V_{threshold}$ or $V_{th}$) implant. Thus, the concentration of boron would be greater at the surface of the silicon substrate in an N-channel metal oxide semiconductor FET (NMOSFET or NMOS transistor or NMOS), for example. This increased concentration of the punch-through dopant, in turn, tends to make the threshold voltage $V_{th}$ of the FET higher. Increases in the threshold voltage $V_{th}$ of a FET are undesirable for a number of reasons. For example, an increase in the threshold voltage $V_{th}$ tends to make an "enhanced mode" NMOS transistor harder to turn "ON" and may also result in the reduction of the drive current of the device.

Typically, the current flow through the channel of a MOSFET or MOS transistor is relatively unconfined. In particular, the presence of a leakage current to the substrate is certainly possible and virtually inevitable. Furthermore, in the case of complementary MOS (CMOS) structures having adjacent PMOS and NMOS transistors, the potential for latchup is usually present.

The present invention is directed to overcoming, or at least reducing the effects of, one or more of the problems set forth above.

SUMMARY OF THE INVENTION

In one aspect of the present invention, a method is provided for fabricating a transistor, the method including forming a dielectric layer above a structure, forming a first polysilicon layer above the dielectric layer and forming a sacrificial region above the first polysilicon layer. The method also includes forming a second polysilicon layer above the first polysilicon layer and adjacent the sacrificial region. The method further includes removing the sacrificial region to form an opening in the second polysilicon layer, the opening having sidewalls, and forming dielectric spacers on the sidewalls of the opening. In addition, the method includes forming a gate dielectric within the opening above the first polysilicon layer and forming a gate conductor above the gate dielectric.

BRIEF DESCRIPTION OF THE DRAWINGS

The invention may be best understood by reference to the following description taken in conjunction with the accompanying drawings, in which the leftmost significant digit(s) in the reference numerals denote(s) the first figure in which the respective reference numerals appear, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of the present invention are shown in FIGS. 1–14 and FIG. 15. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 1:
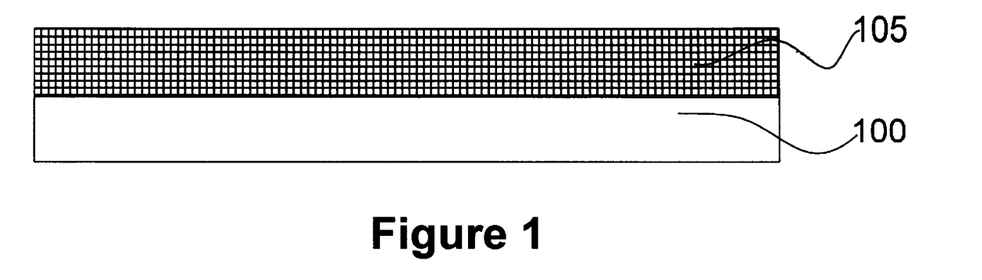
FIGS. 1–14 show schematically in cross-section various illustrative embodiments of a method for fabricating a transistor in accordance with the present invention.
Figure 15:
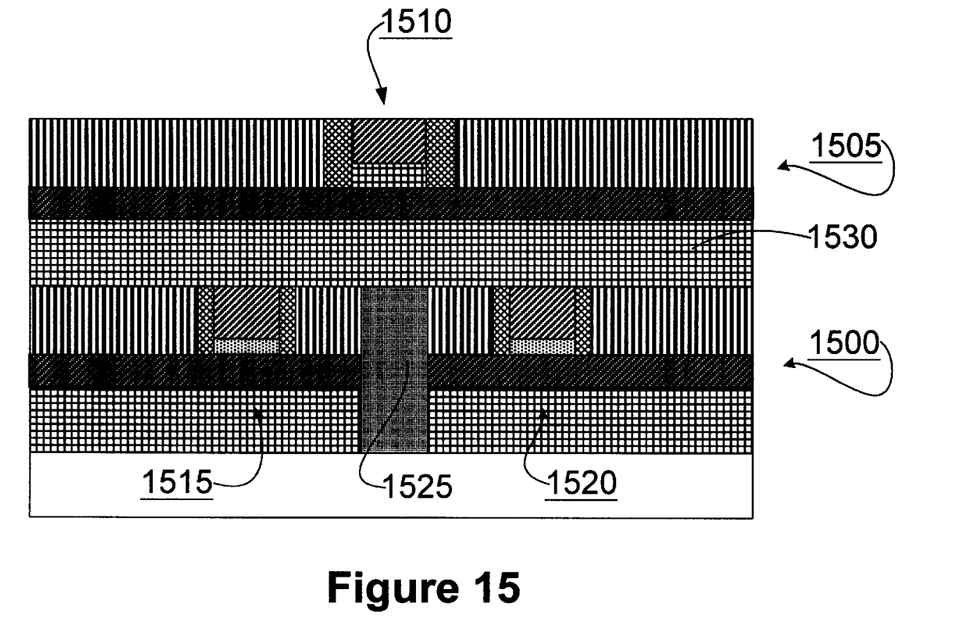
FIG. 15 shows schematically in cross-section another illustrative embodiment of a method for fabricating a transistor in accordance with the present invention.

As shown in FIG. 1, a dielectric layer 105 may be formed above a structure 100 such as a semiconducting substrate. However, the present invention is not limited to the formation of a transistor above the surface of a semiconducting substrate such as a silicon wafer, for example. Rather, as will be apparent to one skilled in the art upon a complete reading of the present disclosure, a transistor formed in accordance with the present invention may be formed above previously formed semiconductor devices, e.g., transistors, or other similar structure. In effect, the present invention may be used to form transistors on top of previously formed transistors, as shown in FIG. 15, for example.

The dielectric layer 105 may be formed by a variety of known techniques for forming such layers, including, but not limited to, thermal growing, chemical vapor deposition (CVD), sputtering and physical vapor deposition (PVD), low pressure chemical vapor deposition (LPCVD), plasma-enhanced CVD (PECVD), and the like, and may have a thickness ranging from approximately 2000–5000 Å, for example. The dielectric layer 105 may be formed of any suitable "low dielectric constant" or "low K" material, where K is less than or equal to about 4. Additionally, the dielectric layer 105 may be comprised of an oxide (e.g., germanium oxide), a nitride (e.g., gallium arsenide nitride), an oxynitride (e.g., gallium phosphide oxynitride), silicon dioxide ($SiO_2$), nitrogen-bearing $SiO_2$, silicon nitride ($Si_3N_4$), silicon oxynitride ($Si_xO_yN_z$), and the like. In one illustrative embodiment, the dielectric layer 105 is comprised of $SiO_2$, having a thickness of approximately 2000 Å, which is formed by an LPCVD process for higher throughput.

Figure 2:
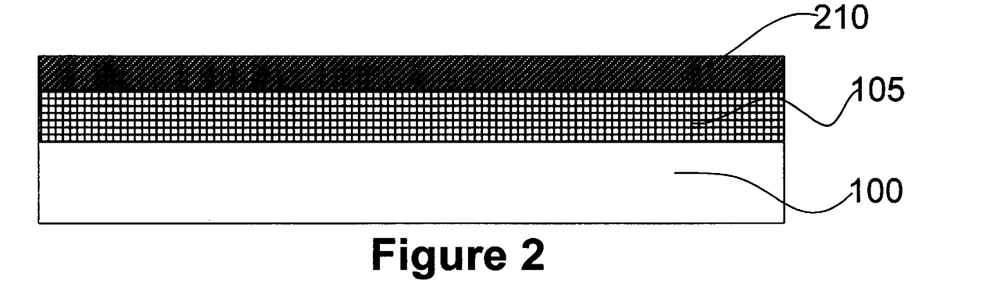

As shown in FIG. 2, a first polysilicon layer 210 may be formed above the dielectric layer 105. The first polysilicon layer 210 may be formed by a variety of known techniques for forming such layers, e.g., CVD, LPCVD or PECVD, and may have a thickness ranging from approximately 500–1000 Å. Eventually, as described more fully below, portions of the polysilicon layer 210 will become the channel region 940 (see FIG. 9) of the transistor 1510 (see FIG. 15). The first polysilicon layer 210 may be undoped. In one illustrative embodiment, the first polysilicon layer 210 is comprised of undoped polysilicon formed by an LPCVD process to a thickness of approximately 500 Å.

Figure 3:
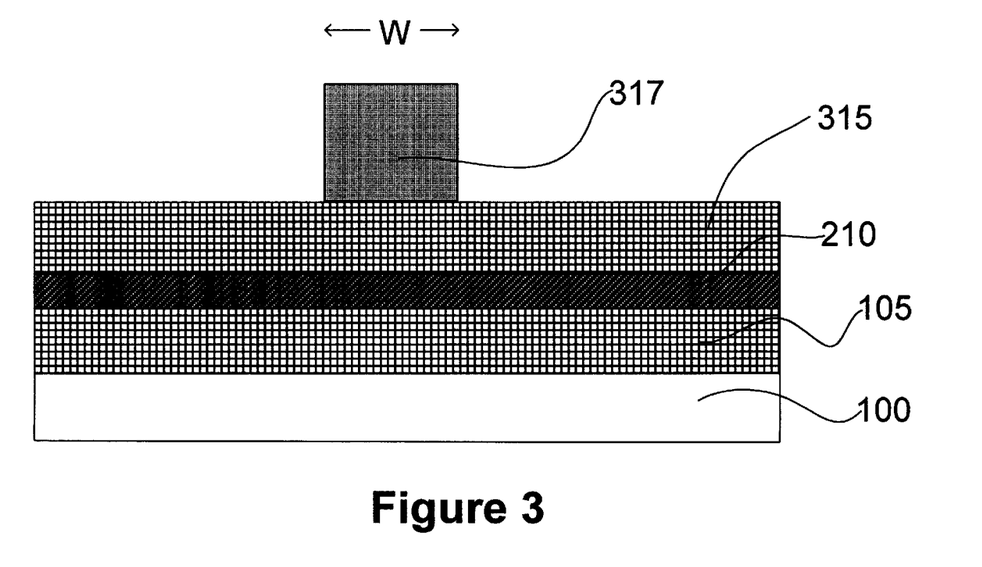
Figure 4:
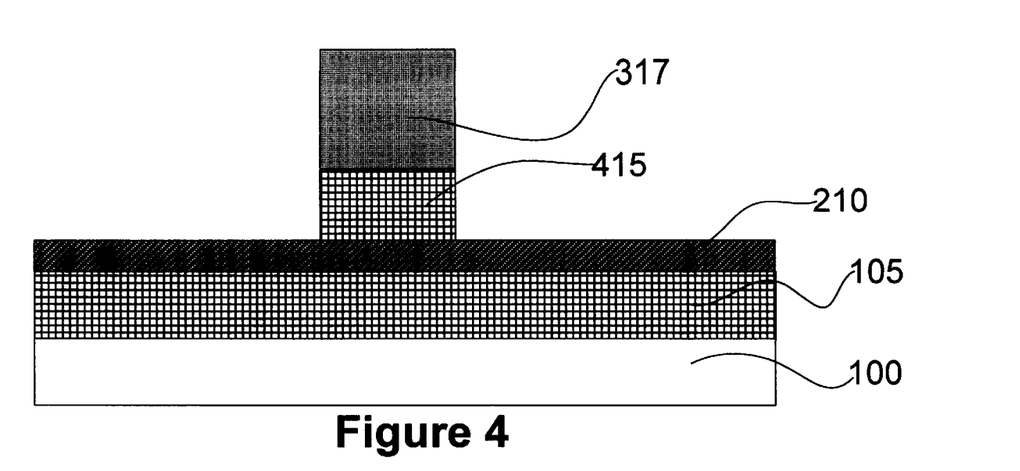
Figure 5:
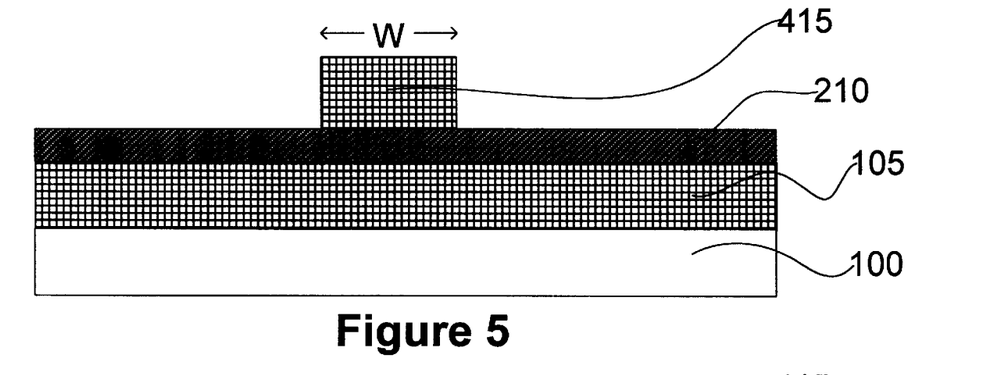

As shown in FIGS. 3–5, a sacrificial region 415 (see FIG. 4) may be formed above the first polysilicon layer 210. For example, the sacrificial region 415 may be formed by patterning a sacrificial layer 315 that is formed above the first polysilicon layer 210, as shown in FIG. 3. The sacrificial layer 315 may be formed by a variety of known techniques for forming such layers, including, but not limited to, thermal growing, CVD, PVD, LPCVD, PECVD, and the like, and may have a thickness ranging from approximately 1000–2000 Å, for example.

The sacrificial region 415 may be formed of any suitable sacrificial material that is able to withstand being subjected to the annealing and heating used to diffuse ion-implanted dopants. For example, the sacrificial layer 315, like the dielectric layer 105, may be formed from a variety of any relatively inexpensive dielectric materials and may be an oxide (e.g., germanium oxide), a nitride (e.g., gallium arsenide nitride), an oxynitride (e.g., gallium phosphide oxynitride), silicon dioxide ($SiO_2$), nitrogen-bearing $SiO_2$, silicon nitride ($Si_3N_4$), silicon oxynitride ($Si_xO_yN_z$), and the like. In one illustrative embodiment, the sacrificial layer 315 is comprised of $SiO_2$, having a thickness of approximately 1000 Å, which is formed by an LPCVD process for higher throughput.

Alternatively, the sacrificial layer 315 may be formed from a variety of suitable easily removable, and relatively inexpensive, materials such as, for example, undoped germanium in silicon (Si—Ge), undoped polysilicon or aluminum (Al), and the like. The sacrificial layer 315 may be formed of any suitable material that is selective with respect to the etching of adjacent portions of a second polysilicon layer 620 (see FIG. 6) that will eventually, as described more fully below, become the source/drain regions 830 and 835 (see FIG. 8) for the MOS transistor 1510 (see FIG. 15).

Eventually, as described more fully below, the patterned sacrificial region 415 of the sacrificial layer 315 will be removed (see FIG. 9). In one illustrative embodiment, the sacrificial layer 315 is comprised of undoped Si—Ge. The concentration of the Ge in the Si—Ge may be in a range of approximately 15–40%. Such a concentration of Ge in the Si—Ge enables relatively easy removal of the Si—Ge using a standard stripping solution used to clean wafers ("RCA solution"), which is a mixture of water ($H_2O$), sulfuric acid ($H_2SO_4$) and hydrogen peroxide ($H_2O_2$) in the proportions 8:1:1. As in the deposition of polysilicon by LPCVD or PECVD, for example, the deposition of the Si—Ge may be effected by introducing 15–40% (by volume or flow) germane ($GeH_4$) process gas along with silane ($SiH_4$) process gas into the process chamber during the deposition.

Further, the sacrificial layer 315 may be patterned into the sacrificial region 415 using a variety of known photolithography and etching techniques, such as an anisotropic etching process using hydrogen bromide (HBr) and argon (Ar) as the etchant gases, for example. As shown in FIG. 3, a mask 317 of photoresist, for example, may be formed above the sacrificial layer 315 and may be patterned. The mask 317 of photoresist may have a thickness ranging from approximately 10000–15000 Å (10 kÅ–15 kÅ), for example, and may be easy to remove. As shown in FIGS. 3–4, using the mask 317 of photoresist, for example, the sacrificial layer 315 may then be etched, forming the patterned sacrificial region 415. As shown in FIG. 5, the mask 317 of photoresist, for example, may then be removed by being stripped off.

The sacrificial region 415 may have a width W (see FIGS. 3 and 5) that may be varied as a matter of design choice. For example, the width W of the sacrificial region 415 may range from approximately 1000–2000 Å.

Figure 6:
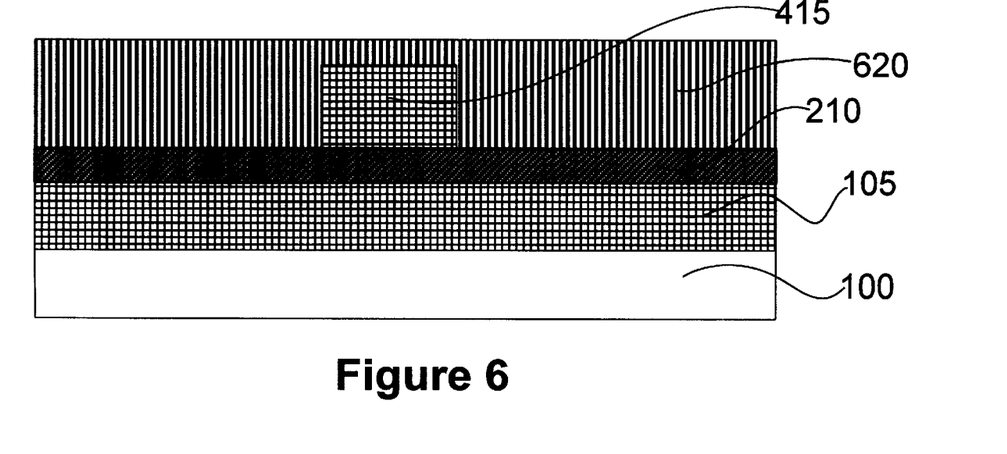

As shown in FIG. 6, the second polysilicon layer 620 may be formed above the first polysilicon layer 210 and adjacent the sacrificial region 415. The second polysilicon layer 620 may be formed by a variety of known techniques for forming such layers, e.g., CVD, LPCVD or PECVD, and may have a thickness ranging from approximately 1000–2000 Å, substantially similar to the thickness of the sacrificial region 415. As mentioned above, and as described more fully below, portions of a second polysilicon layer 620 adjacent the sacrificial region 415 will eventually become the source/drain regions 830 and 835 (see FIG. 8) for the MOS transistor 1510 (see FIG. 15). The second polysilicon layer 620 may also be undoped, like the first polysilicon layer 210. In one illustrative embodiment, the second polysilicon layer 620 is comprised of undoped polysilicon, having a thickness of approximately 1000 Å, which is formed by an LPCVD process for higher throughput.

Figure 7:
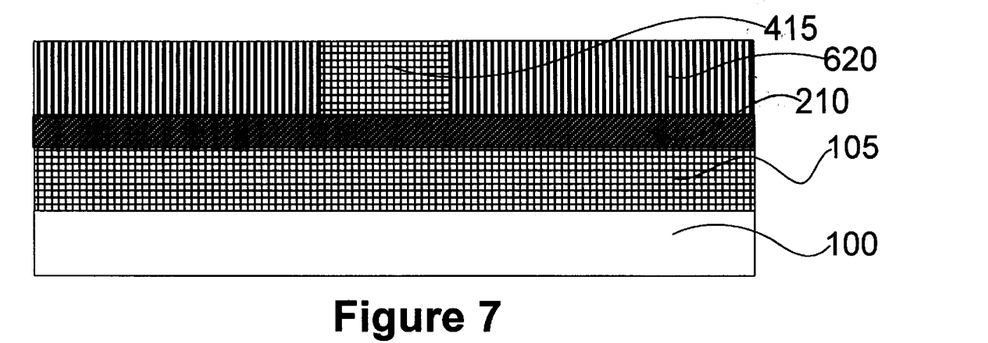

As shown in FIG. 7, the upper portion of the second polysilicon layer 620 may be planarized, for example, by polishing. In particular, the second polysilicon layer 620 may be planarized by a chemical mechanical polishing (CMP) process, for example. As shown in FIG. 7, the planarization of the second polysilicon layer 620 may also planarize the upper portions of the patterned sacrificial region 415. Alternatively, the planarization of the second polysilicon layer 620 may be stopped as soon as the upper portions of the patterned sacrificial region 415 are exposed, so that the upper portions of the patterned sacrificial region 415 would not be planarized to any great extent, or at all.

Figure 8:
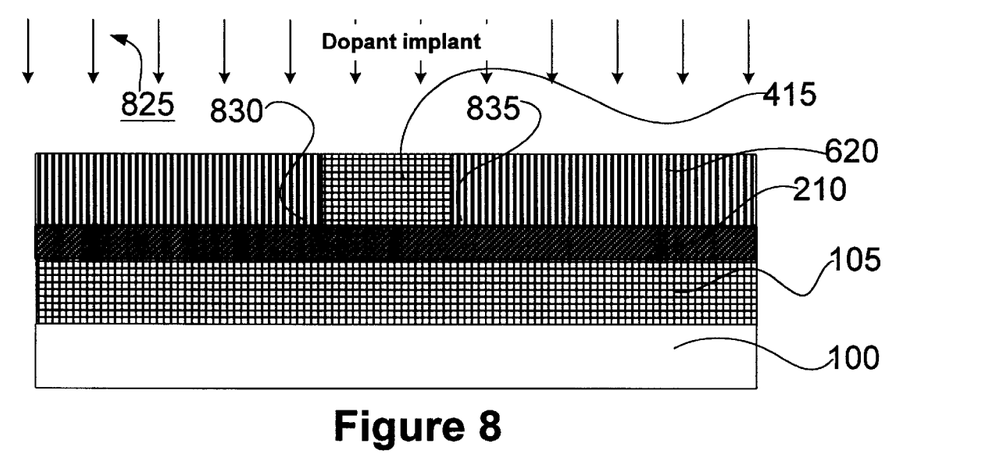

As shown in FIG. 8, a first dopant 825 (indicated by arrows) may be implanted to introduce dopant atoms or molecules into the second polysilicon layer 620 to form doped source/drain regions 830 and 835 on either side of the sacrificial region 415. During this implantation process, the sacrificial region 415 acts as a barrier to prevent the first dopant 825 atoms or molecules from penetrating through the sacrificial region 415 into portions of the first polysilicon layer 210 lying beneath the sacrificial region 415.

In one illustrative embodiment, the dose of first dopant 825 atoms or molecules may range from approximately $4.0 \times 10^{15}$–$9.0 \times 10^{15}$ ions/cm$^2$ of the appropriate first dopant 825 atoms or molecules, e.g., arsenic (As) for an N-channel MOSFET (NMOS transistor or NMOS) or boron (B) for a P-channel MOSFET (PMOS transistor or PMOS). The implant energy of the first dopant 825 atoms or molecules may range from approximately 800 eV to approximately 5 keV. In another illustrative embodiment, the dose of first dopant 825 atoms is approximately $4.0 \times 10^{15}$ ions/cm$^2$ of arsenic (As) for an N-channel MOSFET (NMOS transistor or NMOS) or boron (B) for a P-channel MOSFET (PMOS transistor or PMOS) at an implant energy of approximately 800 eV.

The first dopant 825 may be an N$^+$ implant, for example, such as phosphorus (P), arsenic (As), nitrogen (N), antimony (Sb), or bismuth (Bi) and the like, and may form heavily doped N$^+$ source/drain regions 830 and 835. An N$^+$ implant would be appropriate for the fabrication of an NMOS, for example. Alternatively, the first dopant 825 may be a P$^+$ implant, for example, such as boron (B), boron fluoride (BF, BF$_2$), aluminum (Al), gallium (Ga), Indium (In) or Thallium (Tl) and the like, and may form heavily doped P$^+$ source/drain regions 830 and 835. A P$^+$ implant would be appropriate for the fabrication of a PMOS, for example.

The semiconductor device may next be subjected to a heat-treating process to drive the first dopant 825 atoms or molecules throughout the source/drain regions 830 and 835. The heat-treating process may be performed by a variety of known techniques. For example, the heat-treating process may be a rapid thermal anneal (RTA) process performed at a temperature ranging from approximately 1050–1200° C. for a time ranging from approximately 60 seconds to approximately 2 minutes. Alternatively, the heat-treating process may be performed in a traditional tube furnace at a temperature ranging from approximately 1000–1150° C. for a time period ranging from approximately 30–90 minutes.

As will be recognized by one skilled in the art, the doping of the source/drain regions 830 and 835 may be accomplished by a variety of different techniques. For example, if desired, the appropriate first dopant 825 atoms or molecules may be added during the formation of the second polysilicon layer 620, i.e., dopant atoms, such as arsenic, may be added during the deposition process used to form the second polysilicon layer 620. Alternatively, an undoped second polysilicon layer 620 may be formed and thereafter subjected to an ion implantation process and heat-treating process before etching is performed to define the source/drain regions 830 and 835. As will be known to those skilled in the art, there are a variety of other techniques and methods for introducing dopant atoms or molecules into the portion of the second polysilicon layer 620 that will ultimately become the source/drain regions 830 and 835. Thus, the particular technique used to accomplish this objective should not be considered a limitation of the present invention.

Figure 9:
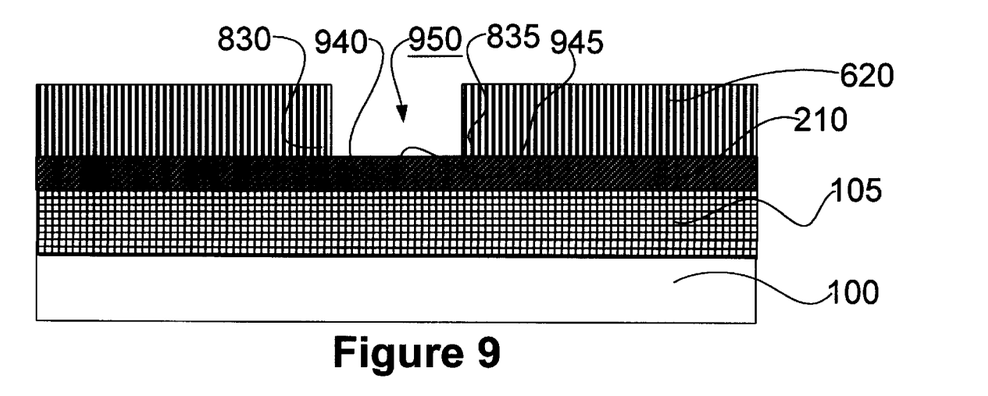

As shown in FIG. 9, the sacrificial region 415 may be removed to expose a channel region 940 in the first polysilicon layer 210 at a bottom 945 of an opening 950 between the doped source/drain regions 830 and 835. The sacrificial region 415 may be removed by etching, for example. The etching to remove the sacrificial region 415 may be anisotropic, such as reactive ion etching (RIE), for example. Alternatively, the etching to remove the sacrificial region 415 may be isotropic, using the selective etchability of the sacrificial region 415 relative to the first and second polysilicon layers 210 and 620, for example. The etch may be a plasma or dry etch, or, alternatively, a wet chemical etch. As an example of a wet chemical etch, a 10:1 hydrogen fluoride (HF)/water (H$_2$O) solution may be used.

Figure 10:
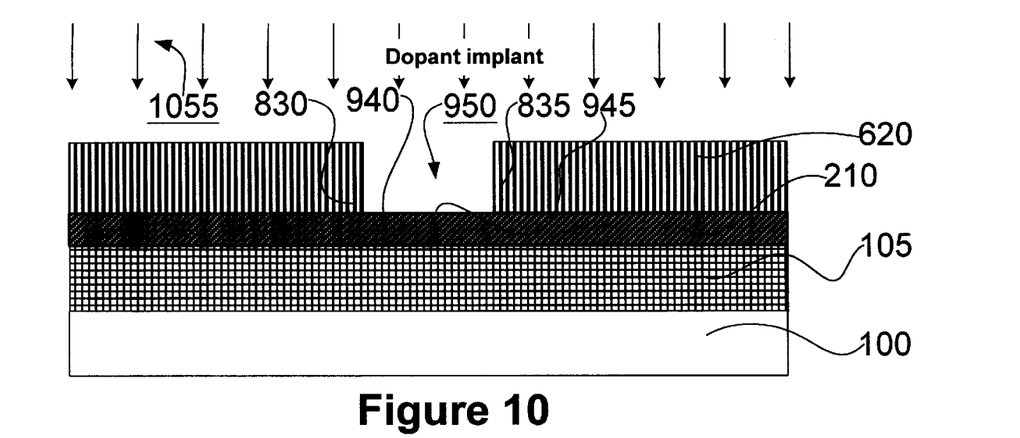

As shown in FIG. 10, a second dopant 1055 (indicated by arrows) may be implanted to adjust a threshold voltage (V$_{threshold}$ or V$_{th}$) for the transistor. In particular, the second dopant 1055 may be implanted into the channel region 940 in the first polysilicon layer 210 at the bottom 945 of the opening 950 between the doped source/drain regions 830 and 835.

In one illustrative embodiment, the dose of second dopant 1055 atoms or molecules may range from approximately $2.0 \times 10^{12}$–$6.0 \times 10^{12}$ ions/cm$^2$ of the appropriate second dopant 825 atoms or molecules, e.g., boron (B) for an NMOS or arsenic (As) for a PMOS. The implant energy of the second dopant 1055 atoms or molecules may range from approximately 1 keV to approximately 10 keV. In another illustrative embodiment, the dose of second dopant 1055 atoms is approximately $2.0 \times 10^{12}$ ions/cm$^2$ of boron (B) for an NMOS or arsenic (As) for a PMOS, at an implant energy of approximately 1 keV, forming a lightly doped threshold voltage V$_{th}$ implant at a depth of approximately 100 Å.

Note that the dose of second dopant 1055 atoms or molecules used for the threshold voltage V$_{th}$ implant is approximately 1500–2000 times smaller than the dose of first dopant 825 atoms or molecules used to dope the source/drain regions 830 and 835. Thus, it is believed that the conductivity type of the source/drain regions 830 and 835 will not be significantly affected by the dose of second dopant 1055 atoms or molecules used for the threshold voltage V$_{th}$ implant. Further, it is believed that the dose of second dopant 1055 atoms or molecules used for the threshold voltage V$_{th}$ implant will not significantly penetrate through the second polysilicon layer 620 into the portions of the first polysilicon layer 210 lying beneath the second polysilicon layer 620.

The second dopant 1055 may be a P-type implant, for example, such as boron (B), boron fluoride (BF, BF$_2$), aluminum (Al), gallium (Ga), Indiun (In) or Thallium (Tl) and the like, and may form a lightly doped threshold voltage V$_{th}$ implant at a depth in a range from approximately 100–400 Å. A P-type implant in the channel region 940 in the first polysilicon layer 210 would be appropriate for adjusting the threshold voltage V$_{th}$ during the fabrication of an NMOS, for example. Alternatively, the second dopant 1055 may be an N-type implant, for example, such as phosphorus (P), arsenic (As), nitrogen (N), antimony (Sb), or bismuth (Bi) and the like, and may form a lightly doped threshold voltage V$_{th}$ implant at a depth in a range from approximately 100–400 Å. An N-type implant would be appropriate for the fabrication of a PMOS, for example.

Variations in the intensity of the second dopant 1055 may be used to form a depletion-mode MOS (an "always on" MOS, even with zero gate bias) or an enhancement-mode MOS (an "always off" MOS, unless the absolute value of the gate bias exceeds the absolute value of the threshold voltage $V_{th}$). Similarly, variations in the conductivity type and/or the intensity of the second dopant 1055 may be used to "finetune" the threshold voltage $V_{th}$ for the MOSFET.

In alternative embodiments, an optional punch-through implant may also be made, either before or after the threshold voltage $V_{th}$ implant. Such a punch-through implant may be implanted deeper into the channel region 940 in the first polysilicon layer 210 at the bottom 945 of the opening 950 between the doped source/drain regions 830 and 835.

In one illustrative embodiment, the dose of the punchthrough implant atoms or molecules may range from approximately $4.0 \times 10^{12} - 1.2 \times 10^{13}$ ions/cm$^2$ (or about twice the dose of second dopant 1055 atoms or molecules used for the threshold voltage $V_{th}$ implant) of the appropriate punchthrough implant atoms or molecules, e.g., boron (B) for an NMOS or arsenic (As) for a PMOS. The implant energy of the punch-through implant atoms or molecules may range from approximately 5 keV to approximately 50 keV (or about five times the implant energy of the second dopant 1055 atoms or molecules used for the threshold voltage $V_{th}$ implant). In another illustrative embodiment, the dose of the punch-through implant is approximately $4.0 \times 10^{12}$ ions/cm$^2$ of boron (B) for an NMOS or arsenic (As) for a PMOS, at an implant energy of approximately 5 keV, forming a less lightly doped punch-through implant at a depth of approximately 500 Å. In such an illustrative embodiment, the peak of the punch-through implant may be located approximately at the interface between the first polysilicon layer 210 and the dielectric layer 105.

Note that the dose of the punch-through implant is approximately 750–1000 times smaller than the dose of first dopant 825 atoms or molecules used to dope the source/drain regions 830 and 835. Thus, it is believed that the conductivity type of the source/drain regions 830 and 835 will not be significantly affected by the dose of the punch-through implant. Further, it is believed that the dose of the punch-through implant will not significantly penetrate through the second polysilicon layer 620 into the portions of the first polysilicon layer 210 lying beneath the second polysilicon layer 620.

The punch-through implant may be P-type, for example, such as boron (B), boron fluoride (BF, BF$_2$), aluminum (Al), gallium (Ga), Indium (In) or Thallium (Tl) and the like, and may form a less lightly doped punch-through implant at a depth in a range from approximately 500–2000 Å (or about five times the depth of the more lightly doped threshold voltage $V_{th}$ implant). A P-type implant in the channel region 940 in the first polysilicon layer 210 would be appropriate for preventing (or reducing) punch-through for an NMOS, for example. Alternatively, the punch-through implant may be an N-type implant, for example, such as phosphorus (P), arsenic (As), nitrogen (N), antimony (Sb), or bismuth (Bi) and the like, and may form a less lightly doped punch-through implant at a depth in a range from approximately 500–2000 Å (or about five times the depth of the more lightly doped threshold voltage $V_{th}$ implant). An N-type implant would be appropriate for preventing (or reducing) punch-through for a PMOS, for example.

Figure 11:
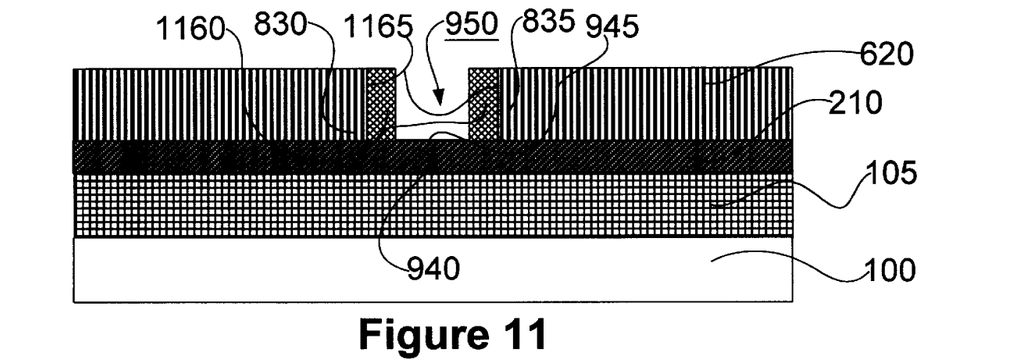

As shown in FIG. 11, dielectric spacers 1160 may be formed on the sidewalls 1165 of the opening 950. The dielectric spacers 1160 may be formed by being selectively thermally grown on the sidewalls 1165 of the opening 950. Alternatively, the dielectric spacers 1160 may be formed by being selectively deposited on the sidewalls 1165 of the opening 950, or by being conformally blanket-deposited and then selectively etched, as by anisotropic reactive ion etching (RIE), for example. The dielectric spacers 1160 may each have a base thickness (measured horizontally from the sidewalls 1165 at the bottom 945 of the opening 950) ranging from approximately 100–300 Å, for example. The dielectric spacers 1160, like the first dielectric layer 105, may be formed from a variety of dielectric materials and may, for example, be an oxide (e.g., germanium oxide), a nitride (e.g. gallium arsenide nitride), an oxynitride (e.g., gallium phosphide oxynitride), silicon dioxide (SiO$_2$), nitrogen-bearing SiO$_2$, silicon nitride (Si$_3$N$_4$), silicon oxynitride (Si$_x$O$_y$N$_z$), and the like. In one illustrative embodiment, the dielectric spacers 1160 are comprised of SiO$_2$, having a base thickness of approximately 100 Å, which are formed by using an LPCVD process, for higher throughput, to deposit a conformal layer of SiO$_2$ and then anisotropically etching that layer.

Figure 12:
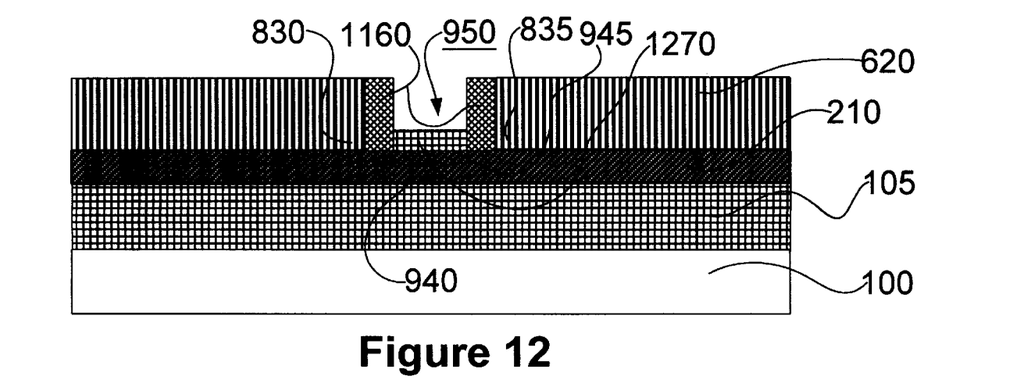

As shown in FIG. 12, a gate dielectric 1270 may be formed above the channel region 940 at the bottom 945 of the opening 950 between the doped source/drain regions 830 and 835. The gate dielectric 1270 may be formed by a variety of known techniques for forming such a structure, including, but not limited to, thermal growing, CVD, PVD, LPCVD, PECVD, and the like, and may have a thickness ranging from approximately 15–25 Å, for example.

The gate dielectric 1270 may be formed by, for example, thermally growing a layer of dielectric material above the exposed surfaces of the first and second polysilicon layers 210 and 620, including above the channel region 940 at the bottom 945 of the opening 950 between the doped source/drain regions 830 and 835. Note that the gate dielectric 1270 material would not thermally grow on the dielectric spacers 1160 on the sidewalls 1165 of the opening 950. Thereafter, the thermally grown dielectric material that was formed above the exposed surfaces of the first and second polysilicon layers 210 and 620, other than the gate dielectric 1270 formed above the channel region 940 at the bottom 945 of the opening 950, may then be removed by, for example, polishing using CMP. Alternatively, the exposed surfaces of the first and second polysilicon layers 210 and 620, other than the surface of the first polysilicon layer 210 above the channel region 940 at the bottom 945 of the opening 950, may be masked prior to thermally growing the layer of dielectric material. Thereafter, the thermally grown dielectric material of the gate dielectric 1270 may then be formed substantially only on the exposed surface of the first polysilicon layer 210 above the channel region 940 at the bottom 945 of the opening 950.

The gate dielectric 1270 may be formed from a variety of dielectric materials and may, for example, be formed of any suitable "high dielectric constant" or "high K" material, where K is greater than or equal to about 8, such as titanium oxide (Ti$_x$O$_y$, e.g., TiO$_2$), tantalum oxide (Ta$_x$O$_y$, e.g., Ta$_2$O$_5$), barium strontium titanate (BST, BaTiO$_3$/SrTiO$_3$), and the like. Alternatively, the gate dielectric 1270 may be an oxide (e.g., germanium oxide), a nitride (e.g., gallium arsenide nitride), an oxynitride (e.g., gallium phosphide oxynitride), silicon dioxide (SiO$_2$), nitrogen-bearing SiO$_2$, silicon nitride (Si$_3$N$_4$), silicon oxynitride (Si$_x$O$_y$N$_z$), and the like. In one illustrative embodiment, the gate dielectric 1270 is comprised of SiO$_2$, having a thickness of approximately 15 Å, which is thermally grown for higher throughput.

Figure 13:
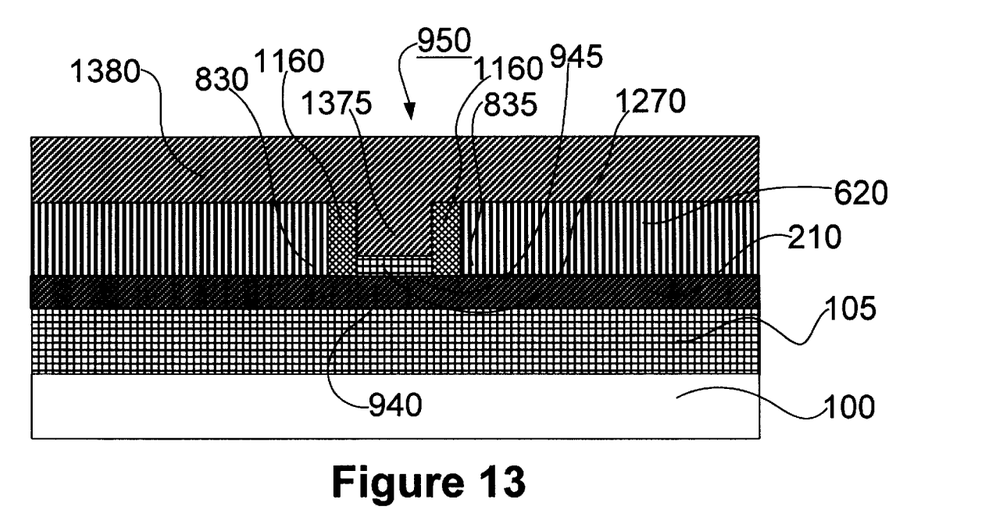
Figure 14:
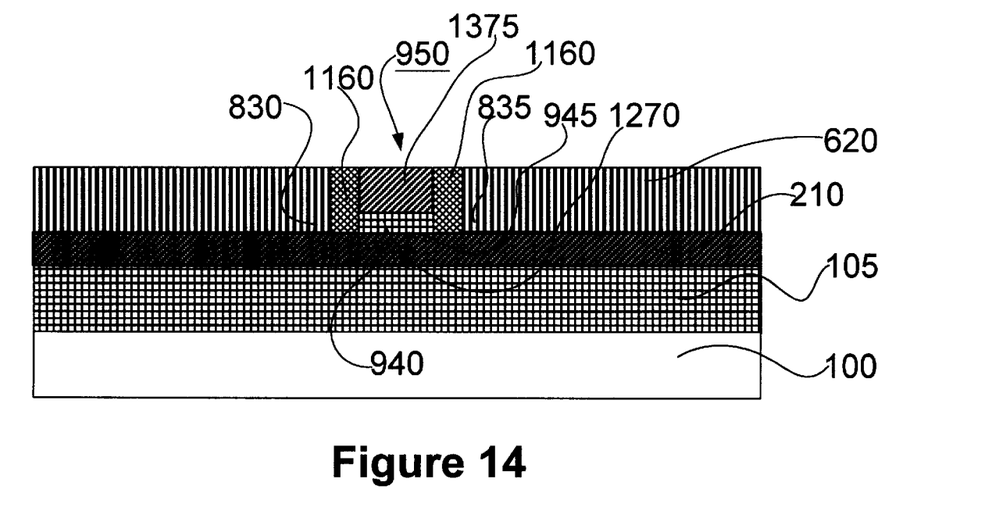

As shown in FIGS. 13 and 14, a gate conductor 1375 may be formed above the gate dielectric 1270 within the opening 950. The gate conductor 1375 may be formed by a variety of known techniques. For example, the gate conductor 1375 may be formed by first forming a conductive layer 1380 above the planarized second polysilicon layer 620, adjacent the dielectric spacers 1160, within the opening 950 and above the gate dielectric 1270. Thereafter, a CMP process may then be used to planarize the conductive layer 1380 to remove those portions of the conductive layer 1380 lying outside the opening 950, leaving only those portions of the conductive layer 1380 lying within the opening 950 to become the gate conductor 1375 above the gate dielectric 1270 and between the dielectric spacers 1160.

The conductive layer 1380 may be formed by a variety of known techniques for forming such layers, e.g., CVD, LPCVD or PECVD, and may have a thickness ranging from approximately 1000–2000 Å. The gate conductor 1375 may be formed of a variety of materials suitable for use as a gate conductor in transistor devices. For example, the gate conductor 1375 may be formed of aluminum (Al), tungsten (W), tantalum (Ta), copper (Cu), and the like. Alternatively, the gate conductor 1375 may be formed of doped polysilicon that is then subjected to a final anneal to render the doped polysilicon more conductive. In one illustrative embodiment, the gate conductor 1375 is comprised of copper (Cu), having a thickness (measured from the top surface of the gate dielectric 1270) of approximately 985 Å, which is formed by a damascene process for higher throughput.

In an alternative embodiment, the portions of the gate dielectric material that were formed on the exposed surfaces of the first and second polysilicon layers 210 and 620 may not have been removed. In this case, the conductive layer 1380 may then be formed of doped polysilicon that is blanket-deposited above the gate dielectric material and the dielectric spacers 1160 and then subjected to a final anneal to render the doped polysilicon more conductive. Such a doped polysilicon conductive layer 1380 may then be polished, for example, by CMP, leaving a portion of the doped polysilicon conductive layer 1380 formed only in the opening 950 and exposing both the portions of the gate dielectric material left remaining above the second polysilicon layer 620 and the upper portions of the dielectric spacers 1160. The portion of the doped polysilicon conductive layer 1380 formed only in the opening 950 may then be subjected to a self-aligned silicidization (salicidization) process to render the gate conductor 1375 even more conductive. Note that both the portions of the gate dielectric material left remaining above the second polysilicon layer 620 and the upper portions of the dielectric spacers 1160 may assist in preventing silicide formation both above the second polysilicon layer 620 and above the upper portions of the dielectric spacers 1160, facilitating the salicidization process.

The conductive layer 1380 in any of the embodiments may be planarized by polishing, for example. In particular, the conductive layer 1380 may be planarized by CMP, for example. As shown in FIGS. 13 and 14, the planarization of the conductive layer 1380 may also planarize the upper portions of the second polysilicon layer 620 and the upper portions of the dielectric spacers 1160. Alternatively, the planarization of the conductive layer 1380 may be stopped as soon as the upper portions of the second polysilicon layer 620 and/or the upper portions of the dielectric spacers 1160 are exposed, so that the upper portions of the second polysilicon layer 620 and/or the upper portions of the dielectric spacers 1160 would not be planarized to any great extent, or at all.

As stated previously, the present invention may be used to form a plurality of transistors above other previously formed transistors, i e., the present invention may be used to form multiple layers of transistors. For example, as shown in FIG. 15, a semiconductor device, such as MOS structure 1505 similar to the MOS structure as shown in FIG. 14, is formed, using the present invention, above another semiconductor device, such as CMOS structure 1500. As shown in FIG. 15, the CMOS structure 1500 is an example of a structure 100 as shown in FIGS. 1–14. The transistor 1510 in the MOS structure 1505 may be an NMOS or a PMOS. The transistor 1515 in the CMOS structure 1500 may be an NMOS or a PMOS, while the transistor 1520 in the CMOS structure 1500 may be a PMOS or an NMOS, respectively. The transistors 1515 and 1520 in the CMOS structure 1500 may be separated by a trench isolation dielectric structure 1525. The dielectric layer 1530 in the MOS structure 1505 separates and isolates the transistor 1510 in the MOS structure 1505 from the transistors 1515 and 1520 in the CMOS structure 1500.

Any of the above-disclosed embodiments of a method for fabricating a transistor according to the present invention enables enhanced junction control and enhanced speed of operation of the transistor and provides enhanced transistor properties such as confinement of the current flow from source to drain only and substantial elimination of leakage current to the substrate. When a method for CMOS fabrication according to the present invention is used, there is a decreased potential for latchup. Furthermore, the above-disclosed embodiments of methods for transistor fabrication according to the present invention enable fabrication with increased device density and precision and enable a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating a transistor, the method comprising:

forming a dielectric layer above a structure;

forming a first polysilicon layer above the dielectric layer;

forming a sacrificial region above the first polysilicon layer;

forming a second polysilicon layer above the first polysilicon layer and adjacent the sacrificial region;

removing the sacrificial region to form an opening in the second polysilicon layer, the opening having sidewalls;

forming dielectric spacers on the sidewalls of the opening;

forming a gate dielectric within the opening above the first polysilicon layer; and forming a gate conductor above the gate dielectric.

2. The method of claim 1, further comprising:

planarizing the second polysilicon layer;

implanting a first dopant into portions of the second polysilicon layer adjacent the opening to form source/drain regions; and implanting a second dopant into portions of the first polysilicon layer within the opening to adjust a threshold voltage for the transistor, wherein the formation of the sacrificial region further comprises:

forming a sacrificial layer above the first polysilicon layer and patterning the sacrificial layer to form the sacrificial region, wherein the formation of the gate conductor further comprises:

forming a conductive layer above the planarized second polysilicon layer and adjacent the dielectric spacers and within the opening; and planarizing the conductive layer to be present only in the opening.

3. The method of claim 1, wherein the dielectric layer and the sacrificial layer are formed by deposition.

4. The method of claim 1, wherein the first and second polysilicon layers are formed by deposition.

5. The method of claim 1, wherein the patterning of the sacrificial layer includes etching.

6. The method of claim 1, wherein the removal of the sacrificial region includes etching.

7. The method of claim 1, wherein the gate dielectric and gate conductor are formed by deposition.

8. The method of claim 2, wherein the planarization of the second polysilicon layer includes polishing.

9. The method of claim 8, wherein the polishing includes chemical mechanical polishing.

10. The method of claim 2, wherein the planarization of the conductive layer to be present only in the opening includes chemical mechanical polishing.

11. A method for fabricating a transistor, the method comprising:
depositing a dielectric layer above a structure;
depositing a first polysilicon layer above the dielectric layer;
depositing and patterning a sacrificial layer above the first polysilicon layer;
depositing a second polysilicon layer above the first polysilicon layer and adjacent the patterned sacrificial layer;
polishing the second polysilicon layer;
implanting a first dopant to form heavily doped source/drain regions;
etching the patterned sacrificial layer to expose a channel region in the first polysilicon layer at a bottom of an opening between the heavily doped source/drain regions;
implanting a second dopant to adjust a threshold voltage for the transistor;
forming dielectric spacers on sidewalls of the opening;
depositing a gate dielectric at the bottom of the opening; and
forming a gate conductor only in the opening.

12. The method of claim 11, wherein the formation of the gate conductor only in the opening further comprises:
depositing a conductive layer above the polished second polysilicon layer and adjacent the dielectric spacers and within the opening; and
polishing the conductive layer to be present only in the opening.

13. The method of claim 11, wherein the polishing of the second polysilicon layer includes chemical mechanical polishing.

14. The method of claim 11, wherein the patterning of the sacrificial layer includes etching.

15. The method of claim 12, wherein the polishing of the conductive layer to be present only in the opening includes chemical mechanical polishing.

16. A method for MOSFET fabrication, the method comprising:
depositing a first dielectric layer above a substrate, the first dielectric layer having a thickness in a range of about 2000 Å–5000 Å;
depositing a first polysilicon layer above the first dielectric layer, the first polysilicon layer having a thickness in a range of about 500 Å–1000 Å;
depositing and patterning a second dielectric layer above the first polysilicon layer, the second dielectric layer having a thickness in a range of about 1000 Å–2000 Å;
depositing a second polysilicon layer above the first polysilicon layer and adjacent the patterned second dielectric layer; the second polysilicon layer having a thickness in a range of about 1000 Å–2000 Å;
polishing the second polysilicon layer using chemical mechanical polishing;
implanting a first dopant into a portion of the planarized second polysilicon layer to form heavily doped source/drain regions of a first conductivity type adjacent the patterned second dielectric layer, a dose of first dopant atoms or molecules ranging from about $4.0\times10^{15}$–$9.0\times10^{15}$ ions/cm$^2$ at an implant energy ranging from about 0.8–5 keV;
etching the patterned second dielectric layer to expose a channel region in a portion of the first polysilicon layer at a bottom of an opening between the heavily doped source/drain regions of the first conductivity type;
implanting a second dopant of a second conductivity type into the portion of the first polysilicon layer at the bottom of the opening between the heavily doped source/drain regions of the first conductivity type to adjust a threshold voltage for the MOSFET, a dose of second dopant atoms or molecules ranging from about $2.0\times10^{12}$–$6.0\times10^{12}$ ions/cm$^2$ at an implant energy ranging from about 1–10 keV;
forming dielectric spacers on sidewalls of the opening, the dielectric spacers having a base thickness in a range of about 100 Å–300 Å;
depositing a gate dielectric at the bottom of the opening, the gate dielectric having a thickness in a range of about 15 Å–25 Å; and
forming a conductive gate layer only in the opening, the conductive gate layer having a thickness in a range of about 975 Å–985 Å.

17. The method of claim 16, wherein the formation of the conductive gate layer only in the opening further comprises:
depositing a conductive layer above the polished second polysilicon layer and adjacent the dielectric spacers and within the opening; and
polishing the conductive layer to be present only in the opening using chemical mechanical polishing.

18. The method of claim 16, wherein the first dielectric layer includes silicon dioxide, the first polysilicon layer includes undoped polysilicon, the second dielectric layer includes silicon dioxide, the second polysilicon layer includes undoped polysilicon, the dielectric spacers include silicon dioxide, the gate dielectric includes silicon dioxide, and the conductive gate layer includes copper.

19. The method of claim 16, wherein the thickness of the first dielectric layer is about 2000 Å, the thickness of the first polysilicon layer is about 500 Å, the thickness of the second dielectric layer is about 1000 Å, the thickness of the second polysilicon layer is about 1000 Å, the base thickness of the dielectric spacers is about 100 Å, the thickness of the gate dielectric is about 15 Å, and the thickness of the conductive gate layer is about 985 Å.

20. The method of claim 16, wherein the first dielectric layer is formed by a first LPCVD processing step, the first polysilicon layer is formed by a second LPCVD processing step, the second dielectric layer is formed by a third LPCVD processing step, the second polysilicon layer is formed by a fourth LPCVD processing step, the dielectric spacers are formed by a fifth LPCVD processing step, the gate dielectric is thermally grown, and the conductive gate layer is formed by a damascene process.

* * * * *